(12) United States Patent
Tenghamn et al.

(10) Patent No.: US 10,838,107 B2
(45) Date of Patent: Nov. 17, 2020

(54) SENSOR SYSTEM FOR MEASURING ACCELERATION AND PRESSURE

(71) Applicant: PGS Geophysical AS, Oslo (NO)

(72) Inventors: Stig Rune Lennart Tenghamn, Houston, TX (US); Frederick James Barr, Pearland, TX (US)

(73) Assignee: PGS Geophysical AS, Oslo (NO)

( * ) Notice: Subject to any disclaimer, the term of this patent is extended or adjusted under 35 U.S.C. 154(b) by 273 days.

(21) Appl. No.: 15/961,679

(22) Filed: Apr. 24, 2018

(65) Prior Publication Data

US 2018/0324507 A1 Nov. 8, 2018

Related U.S. Application Data

(60) Provisional application No. 62/510,972, filed on May 25, 2017, provisional application No. 62/500,537, filed on May 3, 2017.

(51) Int. Cl.
*H04R 1/02* (2006.01)
*G01V 13/00* (2006.01)
(Continued)

(52) U.S. Cl.
CPC .............. *G01V 13/00* (2013.01); *G01L 23/10* (2013.01); *G01L 27/005* (2013.01); *G01P 15/09* (2013.01);
(Continued)

(58) Field of Classification Search
CPC ....................................................... H04R 1/02
See application file for complete search history.

(56) References Cited

U.S. PATENT DOCUMENTS 3,304,534 A * 2/1967 Sykes ................... G01V 1/164
367/157
3,658,147 A 4/1972 Ho et al.
(Continued)

FOREIGN PATENT DOCUMENTS

| EP | 3312639 | 4/2018 |
|---|---|---|
| GB | 2493837 | 2/2013 |

OTHER PUBLICATIONS

Extended European Search Report in Appl. No. 18170696.1 dated Sep. 27, 2018, 7 pages.
(Continued)

*Primary Examiner* — Olisa Anwah

(57) ABSTRACT

Techniques are disclosed relating to sensors configured to measure acceleration and pressure. In various embodiments, an apparatus includes a first hydrophone sensor having a first piezoelectric material and a first housing structure and a second hydrophone sensor having a second piezoelectric material and a second housing structure. In some embodiments, the apparatus includes a first pair of wires configured to provide a first differential voltage and a second pair of wires configured to provide a second differential voltage. The first pair of wires may be coupled to the first hydrophone sensor and the second pair of wires may be coupled to the second hydrophone sensor. In various embodiments, the apparatus is configured to determine, based on the first and second differential voltages, a pressure and an acceleration experienced by the first and second hydrophone sensors.

15 Claims, 13 Drawing Sheets

(51) Int. Cl.

| | |
|---|---|
| *H04R 1/44* | (2006.01) |
| *G01L 23/10* | (2006.01) |
| *G01L 27/00* | (2006.01) |
| *G01P 15/09* | (2006.01) |
| *G01P 21/00* | (2006.01) |
| *H01L 41/113* | (2006.01) |
| *H04R 1/42* | (2006.01) |
| *G01V 1/38* | (2006.01) |
| *G01V 1/16* | (2006.01) |
| *G01V 1/18* | (2006.01) |

(52) U.S. Cl.
CPC .......... *G01P 21/00* (2013.01); *H01L 41/1132* (2013.01); *H04R 1/02* (2013.01); *H04R 1/42* (2013.01); *H04R 1/44* (2013.01); *G01V 1/164* (2013.01); *G01V 1/187* (2013.01); *G01V 1/38* (2013.01)

(56) References Cited

U.S. PATENT DOCUMENTS

| | | | |
|---|---|---|---|
| 3,832,762 A | 9/1974 | Johnston et al. | |
| 4,035,672 A | 7/1977 | Beaverson et al. | |
| 4,945,762 A | 8/1990 | Adamic, Jr. | |
| 5,531,115 A | 7/1996 | Erdley | |
| 5,631,602 A | 5/1997 | Kearney et al. | |
| 6,422,088 B1 | 7/2002 | Oba et al. | |
| 6,580,661 B1 | 6/2003 | Marschall et al. | |
| 6,853,603 B1* | 2/2005 | White | G11C 16/30 326/39 |
| 6,853,604 B2* | 2/2005 | Spackman | G01V 1/16 367/154 |
| 7,684,281 B2 | 3/2010 | Vaage et al. | |
| 2005/0276726 A1 | 12/2005 | McGill et al. | |
| 2006/0150740 A1 | 7/2006 | Kurtz | |
| 2009/0223299 A1 | 9/2009 | Kotovsky | |

OTHER PUBLICATIONS

Dutta et al., "Low Offset, Low Noise, Variable Gain Interfacing Circuit with a Novel Scheme for Sensor Sensitivity and Offset Compensation for MEMS Based, Wheatstone Bridge type, Resistive Smart Sensor," 2011 24th International conference on VLSI Design; IEEE, 2011, 6 pages.

* cited by examiner

SENSOR SYSTEM FOR MEASURING ACCELERATION AND PRESSURE

RELATED APPLICATIONS

The present application claims priority to U.S. Provisional Appl. Nos. 62/500,537 filed May 3, 2017 and 62/510,972 filed May 25, 2017, which are herein incorporated by reference in its entirety.

BACKGROUND

Technical Field

This disclosure relates generally to marine geophysical surveys and, more specifically, to seismic sensors for use in marine geophysical surveys.

Description of the Related Art

A seismic vessel may perform marine geophysical surveys in which information about a local geology is collected and analyzed to determine possible oil and gas reservoirs. To conduct a survey, a seismic vessel often tows seismic sources, such as air guns, and sensor streamers through various bodies of water. These seismic sources produce acoustic energy waves that can penetrate the seabed and reflect off the rock formations below. The sensor streamers may include multiple sensors, such as hydrophones, that detect the energy waves reflected back by the rock formations. These detected waves may be digitized and sent to the seismic vessel where they may be recorded and later used to build a model of the earth's strata in the local geology.

In many instances, it may be beneficial to collect data pertaining to the pressure and the particle motion experienced by the streamers. Traditionally, streamers have relied on hydrophones for detecting pressure produced by energy waves and geophones for detecting water particle motion. Being able to accurately measure motion and pressure may be useful in ensuring more accurate readings about the earth's strata. For example, measuring pressure and motion may allow "ghost" reflections from the water surface to be removed from the seismic data.

Figure 1:
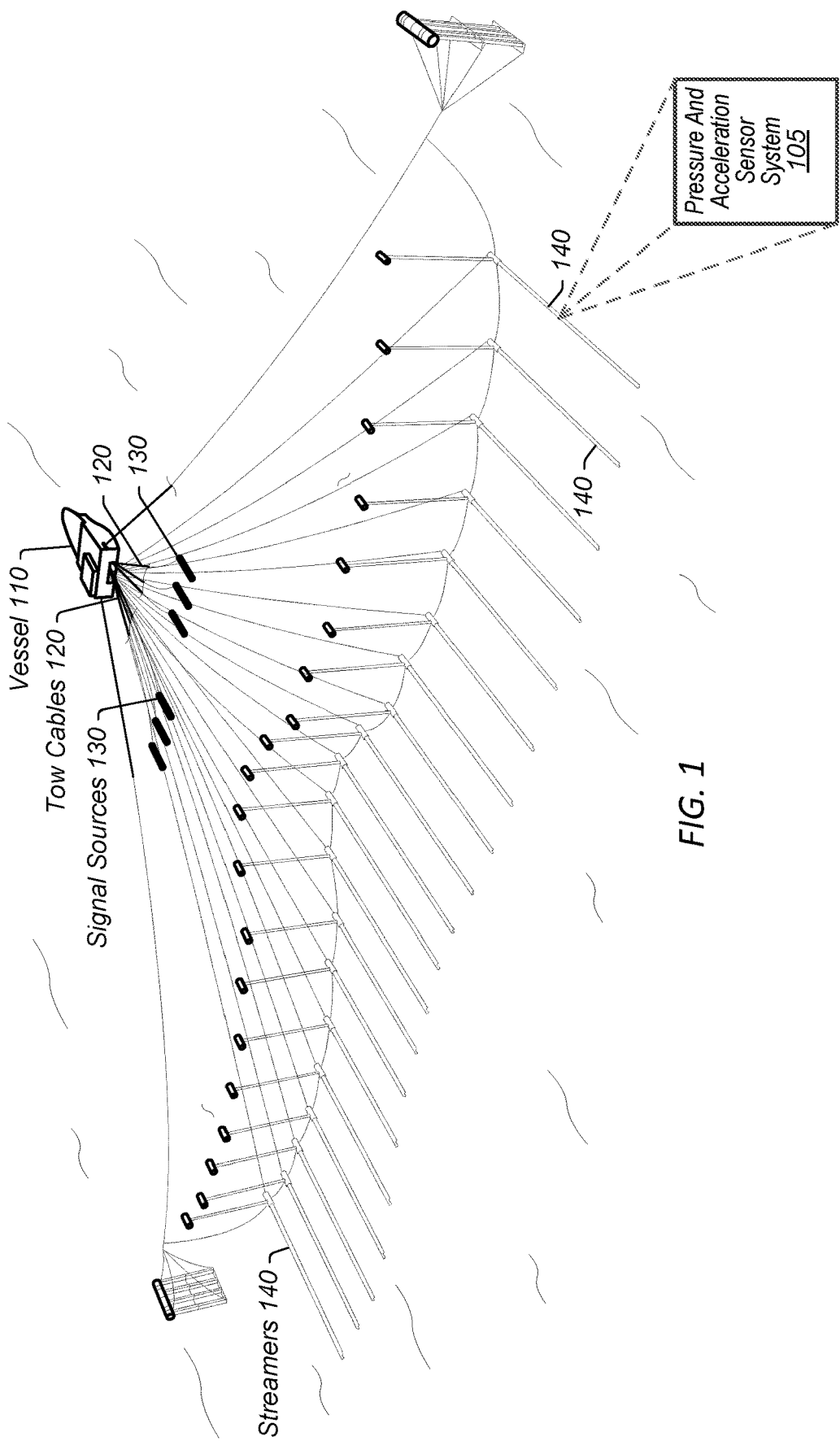
FIG. 1 is a block diagram illustrating a vessel conducting a seismic survey using an array of towed submerged streamers, according to some embodiments.

This disclosure includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. An "amplifier structure configured to amplify a signal" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible. Thus, the "configured to" construct is not used herein to refer to a software entity such as an application programming interface (API).

The term "configured to" is not intended to mean "configurable to." An unprogrammed FPGA, for example, would not be considered to be "configured to" perform some specific function, although it may be "configurable to" perform that function and may be "configured to" perform the function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the terms "first," "second," etc. are used as labels for nouns that they precede, and do not imply any type of ordering (e.g., spatial, temporal, logical, etc.) unless specifically stated. For example, in a structure having eight amplifiers, the terms "first" and "second" amplifiers can used to refer any two of the eight amplifiers.

As used herein, the term "based on" is used to describe one or more factors that affect a determination. This term does not foreclose the possibility that additional factors may affect a determination. That is, a determination may be solely based on specified factors or based on the specified factors as well as other, unspecified factors. Consider the phrase "determine A based on B." This phrase specifies that B is a factor used to determine A or that affects the determination of A. This phrase does not foreclose that the determination of A may also be based on some other factor, such as C. This phrase is also intended to cover an embodiment in which A is determined based solely on B. As used herein, the phrase "based on" is thus synonymous with the phrase "based at least in part on."

DETAILED DESCRIPTION

As mentioned above, seismic sensor streamers may use two different types of sensors: a hydrophone for detecting pressure and a geophone for detecting particle motion. Having different types of sensors for detecting pressure and motion, however, has its drawbacks. First, using two types of sensors increases the number of sensors in seismic streamers, which may be quite lengthy, and thus complicates maintaining the streamers. Second, it can be difficult to isolate one component (e.g., motion) from the other (e.g., pressure) when attempting to measure motion and pressure components. For example, when detecting pressure, a hydrophone may experience motion due to the towing vibration of the streamer, causing the hydrophone to produce an output indicative of pressure when it is in fact noise from the motion.

The present disclosure describes embodiments in which a system is configured to detect both pressure and particle motion in a manner that overcomes some of the downsides of the prior approaches. In various embodiments described below, a stream may include multiple hydrophone sensor pairs having sensors with piezoelectric materials. In such an embodiment, the sensor pairs are arranged in a manner that allows pressure and particle motion in the form of acceleration to be measured simultaneously using the same sensors, as opposed to relying on two distinct sensor types for simultaneous measurement. (Although various references are made below to a sensor pair measuring acceleration, note that such a sensor pair can also be said to measure velocity, which can be determined by integrating acceleration over time.) In some embodiments, the arrangement of a sensor pair also allows for the pressure component and the acceleration component to be easily separated. In particular, the sensor pairs may be coupled to a pair of differential amplifiers in a manner that produces two output signals. The two output signals may then be combined (e.g., through addition) to produce one component (e.g., pressure) and also simultaneously combined (e.g., through subtraction) to produce the other component (e.g., acceleration). As will also be discussed, in some embodiments, a sensor pair also may be coupled to a calibration circuit that can improve pressure and acceleration measurements by accounting for discrepancies that may exist between the piezoelectric materials present in the sensors.

Turning now to FIG. 1, a vessel conducting a seismic survey using an array of towed submersible streamers is shown. In the illustrated embodiment, seismic vessel 110 is towing an array of submersible signal sources 130 and an array of submersible streamers 140 that are coupled to vessel 110 via multiple tow cables 120. As shown, streamers 140 include pressure and acceleration sensor systems 105. In various embodiments, the seismic survey may be implemented differently than shown—e.g., one seismic vessel may tow signal sources 130 and another vessel may tow streamers 140, and more or fewer streamers 140 may be used than are shown in FIG. 1, possibly in a variety of different towing configurations.

Signal sources 130, in various embodiments, are configured to emit a set of signals (e.g., sound waves) measurable by pressure and acceleration sensor systems 105 located on streamers 140. Sources 130 may include a variety of seismic sources, such as marine vibrators or air guns. As such, sources 130 may transmit sound waves into the water, the echoes of which may be detected by systems 105 of the streamers 140. Sources 130 may also include a variety of electromagnetic (EM) sources, such as antennas or magnetic coils. Accordingly, sources 130 may transmit EM signals into the water, which may be detected by the streamers 140.

Pressure and acceleration sensor system 105, in various embodiments, is configured to measure the pressure induced by the signals emitted by sources 130 after they have reflected off the geological formations below the seabed. In such an embodiment, system 105 is also configured to measure the particle acceleration experienced by streamers 140—e.g., the particle acceleration that is induced by the signals emitted from sources 130. In some embodiments, system 105 is coupled to electronic equipment (referred to as "geophysical electronic equipment") aboard vessel 110 that may be used to analyze geophysical data, such as signals measured by system 105 in order to, for example, identify geological formations indicative of oil and/or natural gas deposits as part of a seismic survey. Components within system 105 will now be described in more detail with respect to FIG. 2.

Figure 2:
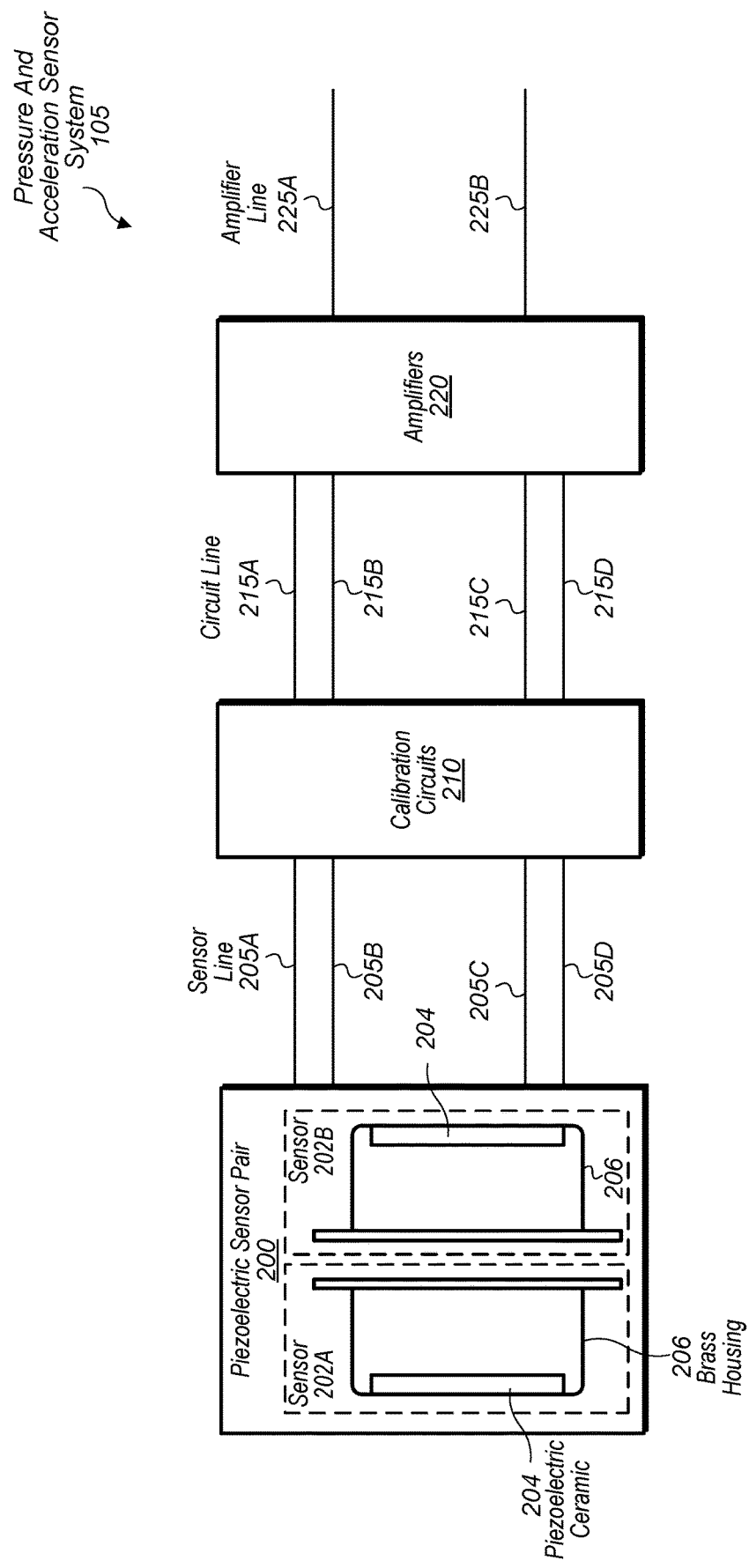
FIG. 2 is a block diagram illustrating exemplary elements of a sensor system that is configured to measure pressure and acceleration, according to some embodiments.

Turning now to FIG. 2, a block diagram of a pressure and acceleration sensor system 105 is shown. In the illustrated embodiment, system 105 includes a piezoelectric sensor pair 200, calibration circuits 210, and amplifiers 220. As shown, sensor pair 200 includes two sensors 202A and 202B, each having a piezoelectric ceramic 204 and a respective brass housing 206 attached to that ceramic 204. While ceramics 204 are shown and discussed below, in various embodiments, other forms of piezoelectric materials may be used such as piezoelectric crystals (e.g., quartz, Rochelle salt, lead titanate, langasite, etc.), biological matter, etc. Similarly, in some embodiments, a different material other than brass may be used for housing 206 such as beryllium, copper, bronze, etc. In various embodiments, system 105 is implemented differently than shown—e.g., system 105 may include amplifiers 220, but not calibration circuits 210, etc.

Sensor pair 200, in various embodiments, is configured to produce voltages indicative of the acceleration and/or the pressured experienced by piezoelectric ceramics 204 (and more generally the streamer 140 that includes that pair 200). In various embodiments, ceramics 204 are piezoelectric materials that produce voltages in response to being stressed by sound waves causing pressure deviation and particle acceleration or by another applied force, which may come from, for example, currents moving through the water pushing streamers 140, orientation members (e.g., steerable birds configured to maintain a particular feather angle) adjusting streamers 140, modules cleaning streamers 140, etc. Accordingly, ceramics 204 may produce voltages when bending in response to a change in pressure or an acceleration in a direction having a vector perpendicular to a face of ceramic 204.

The ability of ceramics 204 to produce voltages when stressed may result from their physical piezoelectric properties. Accordingly, ceramics 204 may have an asymmetric atomic arrangement that leads to the formation of electric dipole moments. When not being stressed, ceramics 204 may be electrically neutral. But, when a stress is applied to ceramics 204, the atomic arrangement may be deformed causing an electric potential difference to exist on the surfaces of ceramics 204. This electric potential difference may generate a current flowing to circuits 210 via lines 205—the manner of which is discussed below with respect to FIG. 3.

Calibration circuits 210, in various embodiments, are configured to correct an imbalance between ceramics 204 in which ceramics 204 of different sensors 202 produce different voltages when experiencing the same pressure and/or acceleration. Accordingly, circuits 210 may adjust sensors 202A and/or 202B such that voltages produced by sensor 202A are similar to voltages produced by sensor 202B in response to the same applied stress. As will be discussed below with FIG. 4, in some embodiments, circuits 210 are voltage dividers coupled to sensors 202.

Amplifiers 220, in various embodiments, are configured to amplify voltages received from calibration circuits 210 via circuit lines 215. As will be discussed with FIG. 5, in various embodiments, amplifiers 220 may include two differential amplifiers configured to amplify differential signals received via lines 215A and 215B and via lines 215C and 215D. As will be discussed with FIG. 6, in some embodiments, these differential signals may be amplified by amplifiers 220 and combined in a manner that enables separate derivation of pressure and the acceleration experienced by system 105.

Figure 3A:
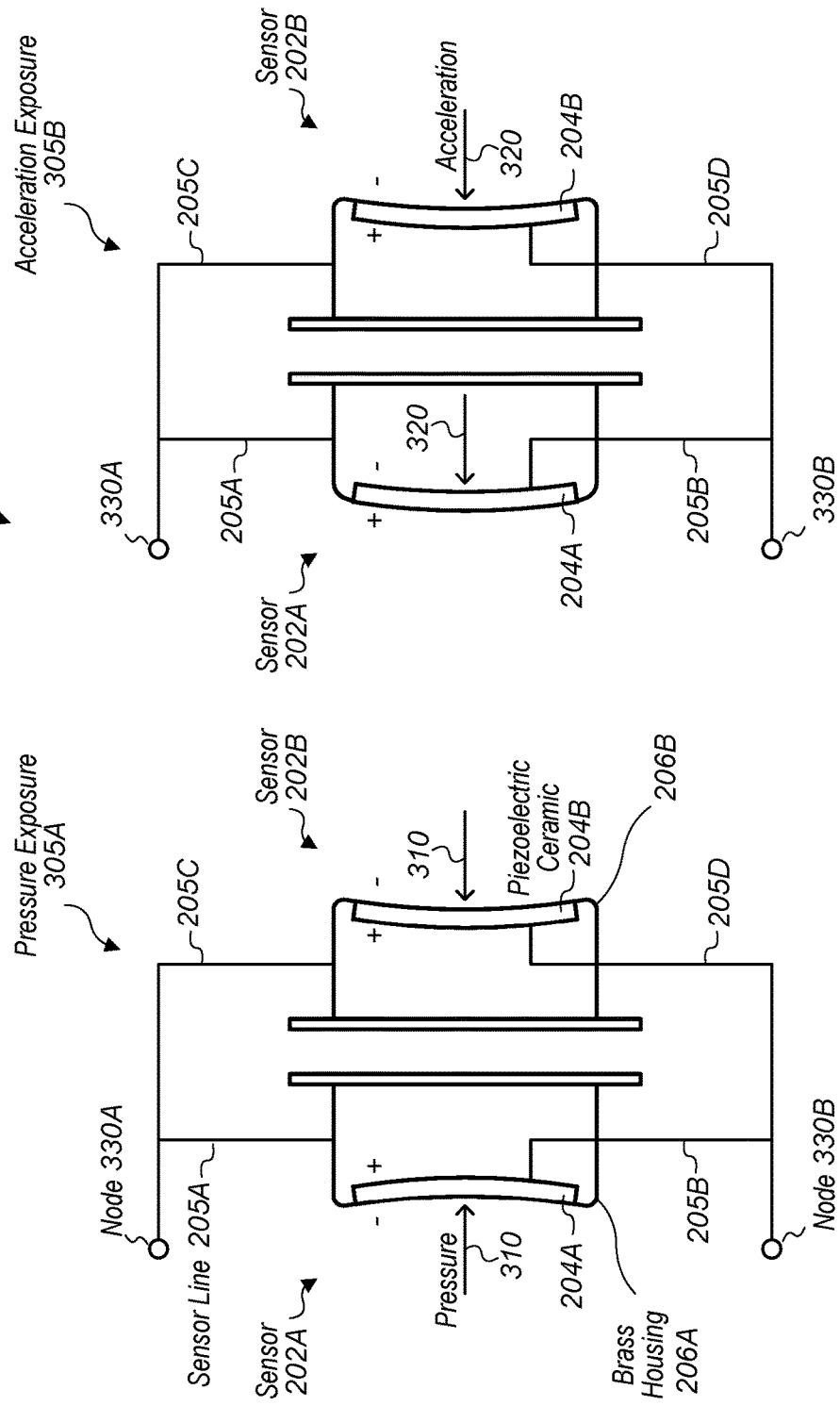
FIG. 3A is a block diagram illustrating exemplary elements of a sensor pair wired to cancel acceleration noise, according to some embodiments.

Turning now to FIG. 3A, a block diagram of a wiring scheme 300 of sensors 202 for suppressing noise caused from acceleration is shown. In the illustrated embodiment, sensors 202 are connected such that a voltage is generated in response to pressure 310 while a voltage that is generated in response to acceleration 320 is attenuated. As shown, pressure exposure 305A depicts the exposure of sensors 202 to a pressure 310, and acceleration exposure 305B depicts the exposure of sensors 202 to an acceleration 320.

As shown in exposures 305, housings 206A and 206B are coupled to the external faces of ceramics 204A and 204B, respectively. Sensor lines 205A and 205C are connected to housings 206, respectively, and are connected together at node 330A. Likewise, sensor lines 205B and 205D are shown as being connected to the internal faces of ceramics 204 and as being connected together at node 330B. In some embodiments, the wiring of sensors 202 may be implemented differently.

In pressure exposure 305A, sensors 202 are exposed to a pressure 310, which causes ceramics 204 to bend inward in this example. As shown, this may result in a positive charge appearing on the convex side of the bend and a negative charge appearing on the concave side. These charges, in turn, may result in a voltage difference between nodes 330, the voltage difference being indicative of an amount of pressure 310 being applied to sensors 202.

In acceleration exposure 305B, sensors 202 are exposed to an acceleration 320, which causes ceramics 204 to bend toward the left for example. A shown, this may result in positive charges being present on the external surface of ceramic 204A and the internal surface of ceramic 204B, and may result in negative charges being present on the internal surface of ceramic 204A and the external surface of ceramic 204B. Due to the configuration of lines 205, however, these charges cancel out, resulting in little or no voltage difference between nodes 330. Thus, with wiring scheme 300, a voltage difference indicative of acceleration 320 is attenuated, while a voltage difference indicative of pressure 310 is preserved.

Figure 3B:
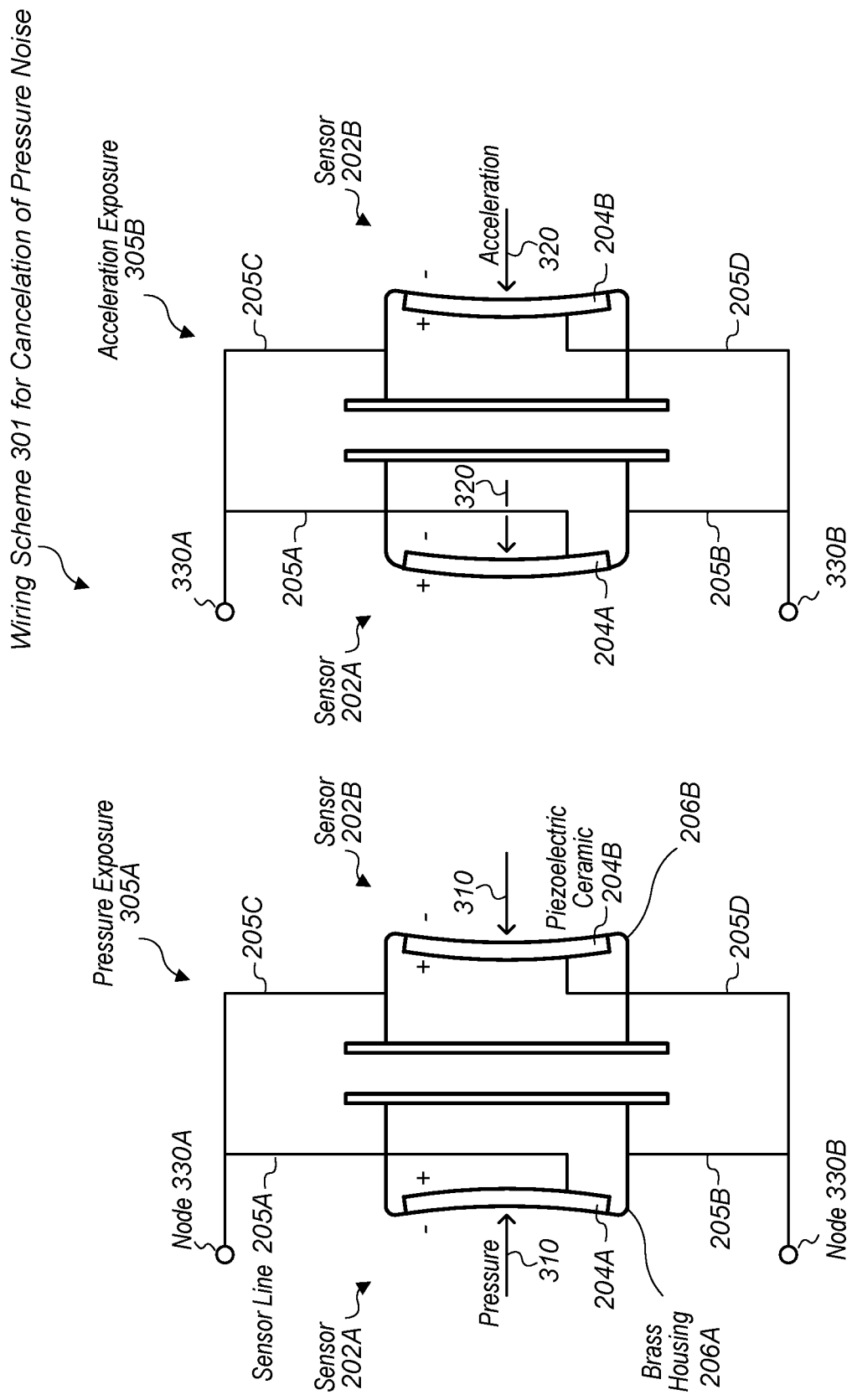
FIG. 3B is a block diagram illustrating exemplary elements of a sensor pair wired to cancel pressure noise, according to some embodiments.

Turning now to FIG. 3B, a block diagram of a wiring scheme 301 of sensors 202 for suppressing the signal caused from pressure alone is shown. In the illustrated embodiment, sensors 202 are connected such that a voltage is generated in response to acceleration 320, while a voltage generated in response to pressure 310 is attenuated.

As shown in exposures 305, brass housings 206 are coupled to ceramics 204 in a manner similar to that of FIG. 3A. In the embodiment of FIG. 3B, however, line 205A is connected to the internal face of ceramic 204A, and line 205B is connected to housing 206A—i.e., lines 205A and 205B are swapped relative to the embodiment of FIG. 3A. Lines 205C and 205D, in some embodiments, may be changed instead of lines 205A and 205B.

As shown, deformations of ceramics 204 responsive to exposures 305 may create positive and negative charges in locations similar to those discussed in relation to FIG. 3A. Due to the different configuration of lines 205, however, a voltage difference indicative of pressure 310 is attenuated in wiring scheme 301 instead of a voltage difference indicative of acceleration 320. In particular, in pressure exposure 305A of wiring scheme 301, the charges cancel out, resulting in little or no voltage difference between nodes 330, while in acceleration exposure 305B of wiring scheme 301, these charges may result in a voltage difference between nodes 330, the voltage difference being indicative of an amount of acceleration 320 being applied to sensors 202.

Figure 4:
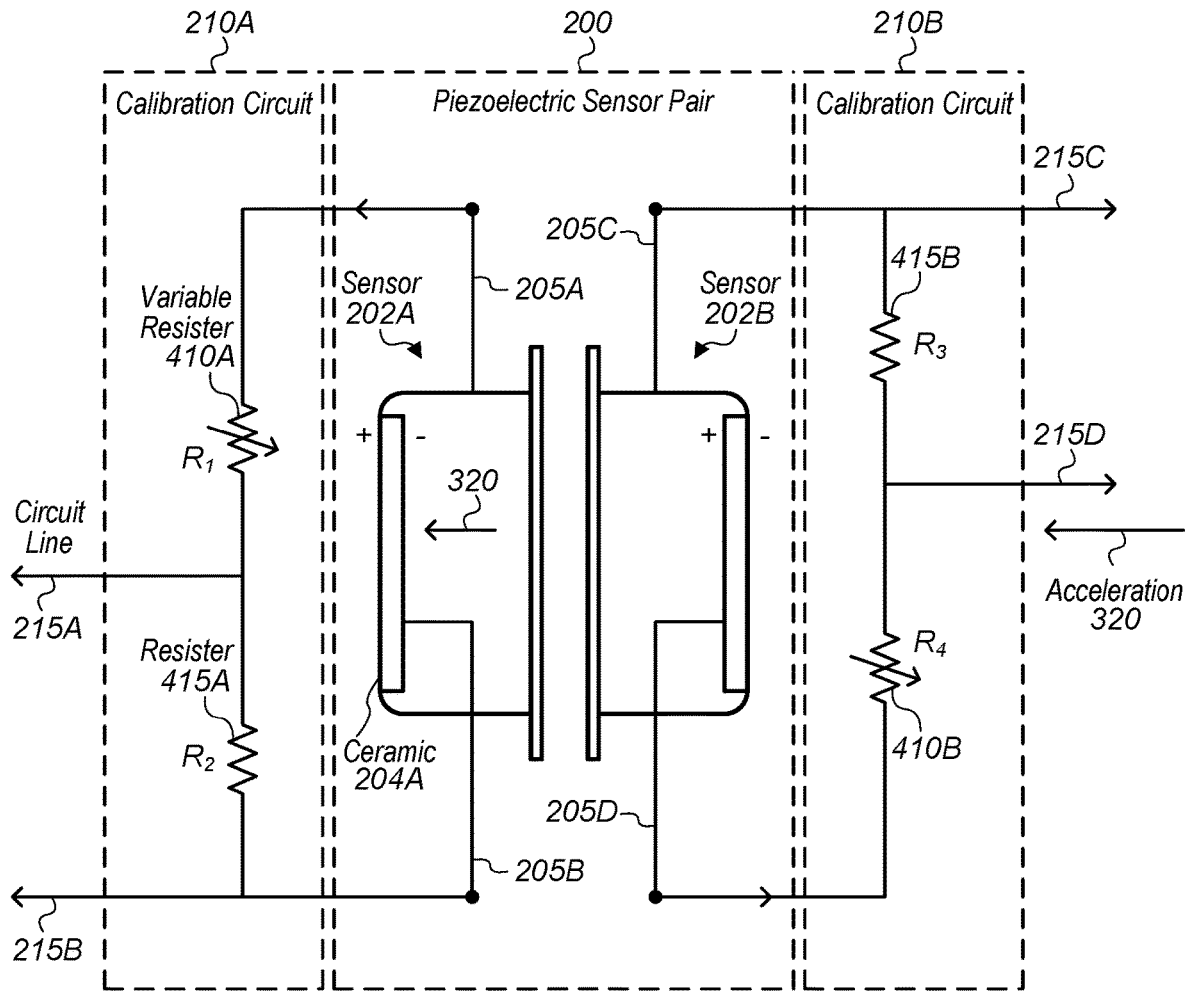
FIG. 4 is a block diagram illustrating exemplary elements of a calibration circuit, according to some embodiments.

Turning now to FIG. 4, a block diagram of a piezoelectric sensor pair 200 coupled to calibration circuits 210A and 210B is shown. As mentioned above, calibration circuits 210 may be configured to calibrate sensors 202 in order to correct an imbalance between the voltages produced by ceramics 204 in different sensors 202. In the illustrated embodiment, circuit 210A includes a variable resistor 410A and a resistor 415A, and circuit 210B includes a variable resistor 410B and a resistor 415B. In some embodiments, pair 200 and circuits 210 are implemented differently—e.g., only one calibration circuit (e.g., circuit 210A) is coupled to sensor pair 200, resistor 415A may be swapped with variable resistor 410A, etc.

Individual ceramics 204 may not always produce the same voltages when exposed to the same pressure 310 or acceleration 320 due to, for example, imperfections in the ceramics. In some instances, this mismatch between ceramics 204 may result in incorrect readings and may complicate determining pressure and acceleration. To correct this issue, in some instances, mass may be added to (or removed from) ceramics 204. In other instances, it may be more beneficial to use calibration circuits 210.

Calibration circuits 210, in various embodiments, adjust the voltages produced by sensors 202 to remove imbalances. In the illustrated embodiment, calibration circuits 210 are voltage dividers, which include a variable resistor 410 and a static resistor 415 placed in series. In various embodiments, variable resistors 415 may be adjusted in order to adjust the differential voltage appearing on circuit lines 215. As an example, when ceramic 204A is producing a higher voltage, variable resister 410A may be increased to produce a greater voltage drop across resistor 410A and thus lower the differential voltage on circuit lines 215A and 215B.

In various instances, calibration circuits 210 may be calibrated prior to being placed in a streamer 140. In some cases, sensors 202 may be exposed to an acceleration 320 using a shaker table. The differential voltages measured on lines 215A-B and lines 215C-D may be compared. Based on the degree of mismatch between the differential voltages, in some embodiments, a resistance value is calculated for at least one of the variable resistors 410 such that the differential voltages match. In some instances, sensors 202 may be exposed to a pressure 310 using an acoustic chamber, and a similar process may then be performed to calibrate circuits 210.

Figure 5:
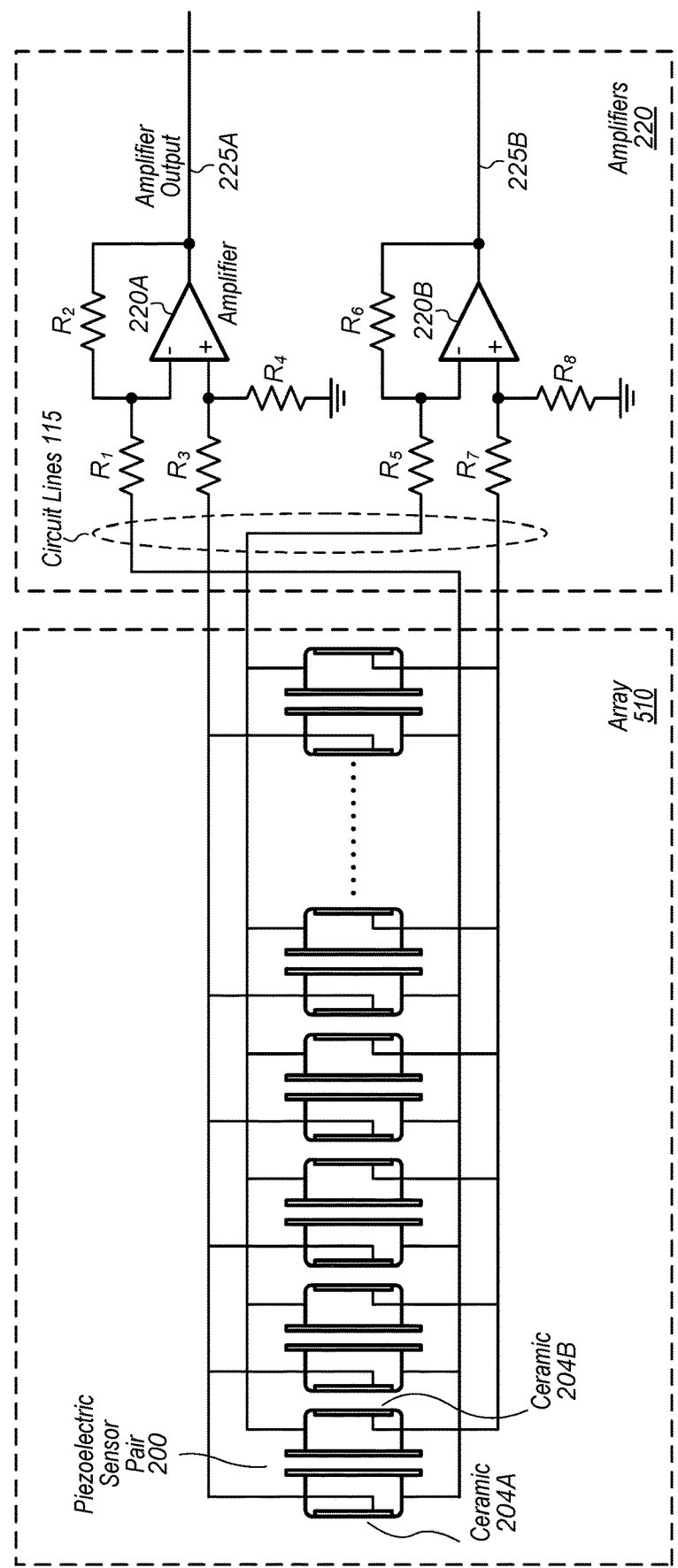
FIG. 5 is a block diagram illustrating exemplary elements of an array of sensor pairs coupled to amplifiers, according to some embodiments.

Turning now to FIG. 5, a block diagram of an array of piezoelectric sensor pairs 200 coupled to amplifiers 220 is shown. In the illustrated embodiment, array 510 includes multiple sensor pairs 200, each of which includes a ceramic 204A coupled to the inputs of amplifier 220A, and a ceramic 204B coupled to the inputs of amplifier 220B. As shown, amplifiers 220 are each coupled to various resistors configured to affect voltage gains applied to differential voltages produced by ceramics 204. While not shown, in various embodiments, each sensor pair 200 may be coupled to a calibration circuit 210, which is coupled to the inputs of amplifiers 220A and/or 220B such as discussed below with FIG. 6. In various embodiments, amplifiers 220 and array 510 may be implemented differently—e.g., the connections of a particular ceramic 204 to the inputs terminals of a particular amplifier 220 may be reversed.

Array 510, in various embodiments, is a series or group of sensor pairs 200 that are configured to measure pressure and acceleration. Each sensor pair 200 may be calibrated prior to being placed in array 510. In some embodiments, streamers 140 may have multiple arrays 510 placed along their length. A given set of two arrays 510 in a streamer 140 may be oriented with a 90 degree angle (or approximately 90 degree angle) between them such that one array 510 measures acceleration in a first direction (e.g., vertical) and the other array 510 measures acceleration in a second direction (e.g., horizontal). Said differently, two arrays 510 may be oriented orthogonal to each other so that they measure the vertical and horizontal components of acceleration 320.

Amplifiers 220, in various embodiments, are configured to amplify the differences between two input voltages received via lines 215. Accordingly, amplifier line 225A is a voltage representative of the difference between lines 215A-B, and amplifier line 225B is a voltage representative of the difference between lines 215C-D.

Amplifiers 220 may be calibrated prior to being placed in a streamer 140. In various embodiments, an adjustment is made to amplifiers 220 such that the voltages resulting from them approximately match. In some embodiments, array 510 and amplifiers 220 may be placed in an acoustic chamber and exposed to pressure 310. The voltages measured at lines 225 may be compared. Based on the degree of mismatch between the voltages, an adjustment to amplifiers 220 and/or their outputs may be determined such that the voltages match. For example, a software program may apply a pre-determined adjustment to the measurements made on lines 225. In some cases, the adjustment may be made to a balance of amplifiers 220. In other cases, the resistors (shown as $R_1, R_2, \ldots, R_8$) coupled to amplifiers 220 may be selected to cause the voltages on lines 225 to match.

Figure 6:
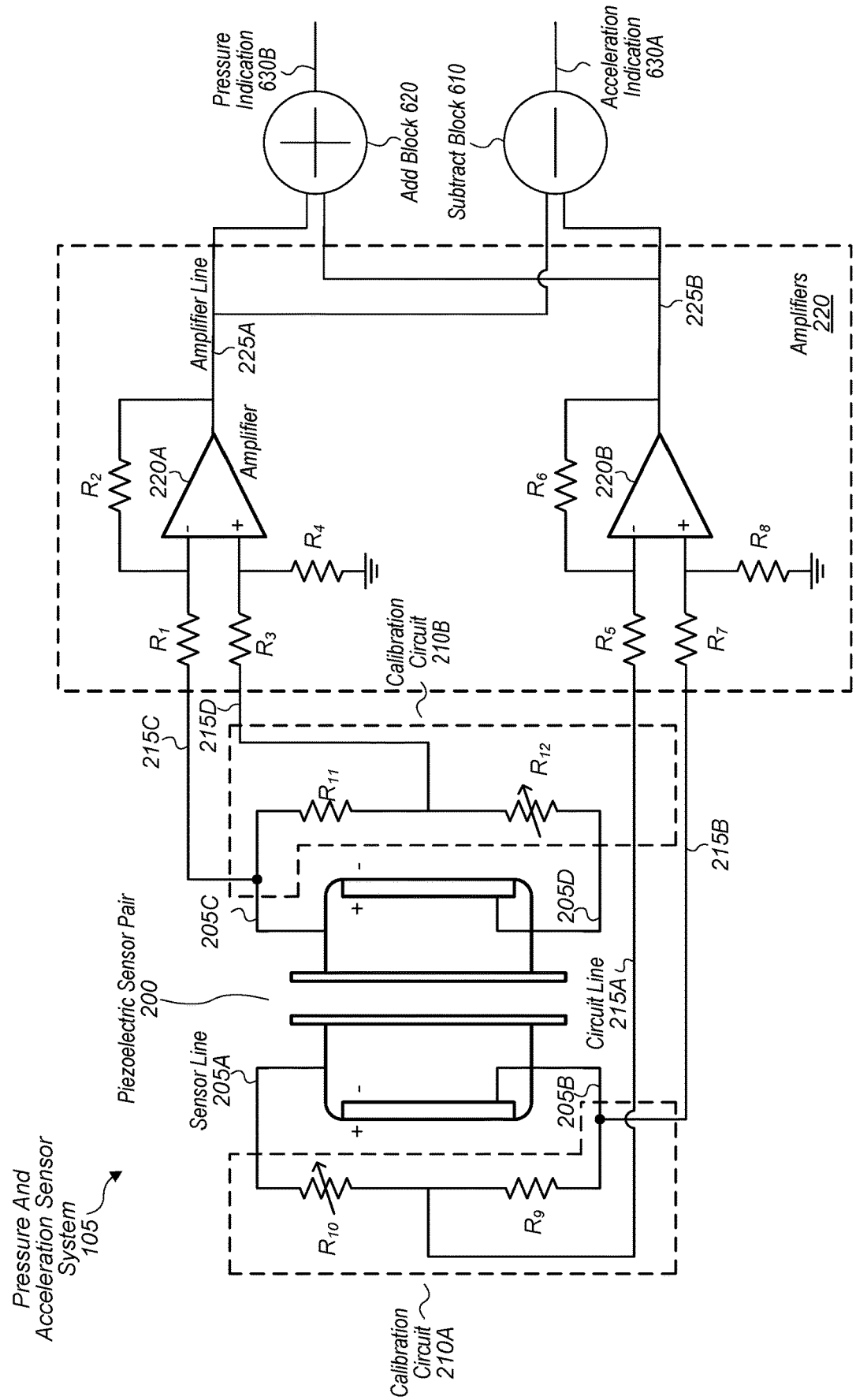
FIG. 6 is a block diagram illustrating exemplary elements of a sensor system that is configured to measure pressure and acceleration, according to some embodiments.

Turning now to FIG. 6, a block diagram of a system 105 is shown. In the illustrated embodiment, system 105 includes a sensor pair 200 coupled to calibration circuits, which themselves are coupled to amplifiers 220. While not shown, system 105 may include multiple sensor pairs 200, each one being coupled to respective calibration circuits 210, which are coupled to amplifiers 220. That is, system 105 may include array 510. In some embodiments, system 105 may be implemented differently than shown—e.g., circuit line 215A is coupled to the positive terminal of amplifier 220B and line 215B is coupled to the negative terminal.

System 105, in various embodiments, is configured to produce indications 630 that are indicative of pressure 310 and acceleration 320 experienced by system 105. In some embodiments, the voltage produced by amplifier 225A is subtracted from the voltage produced by amplifier 225B (or vice versa) at block 610. The difference between the voltages measured at amplifier lines 225 may provide an indication 630A of acceleration 320. In some embodiments, the voltage produced by amplifier 225A is added to the voltage produced by amplifier 220B at block 620. The addition of the two voltages measured at lines 225 may provide an indication 630B of pressure 310. In an embodiment in which the wiring to at least one of the amplifiers 220 is reversed (e.g., the two inputs voltages are swapped at the terminals), the difference between the voltages measured at lines 225 is indicative of pressure and the addition of the voltages is indicative of acceleration. In various embodiments, particle velocity is determined by integrating the measured acceleration.

Figure 7:
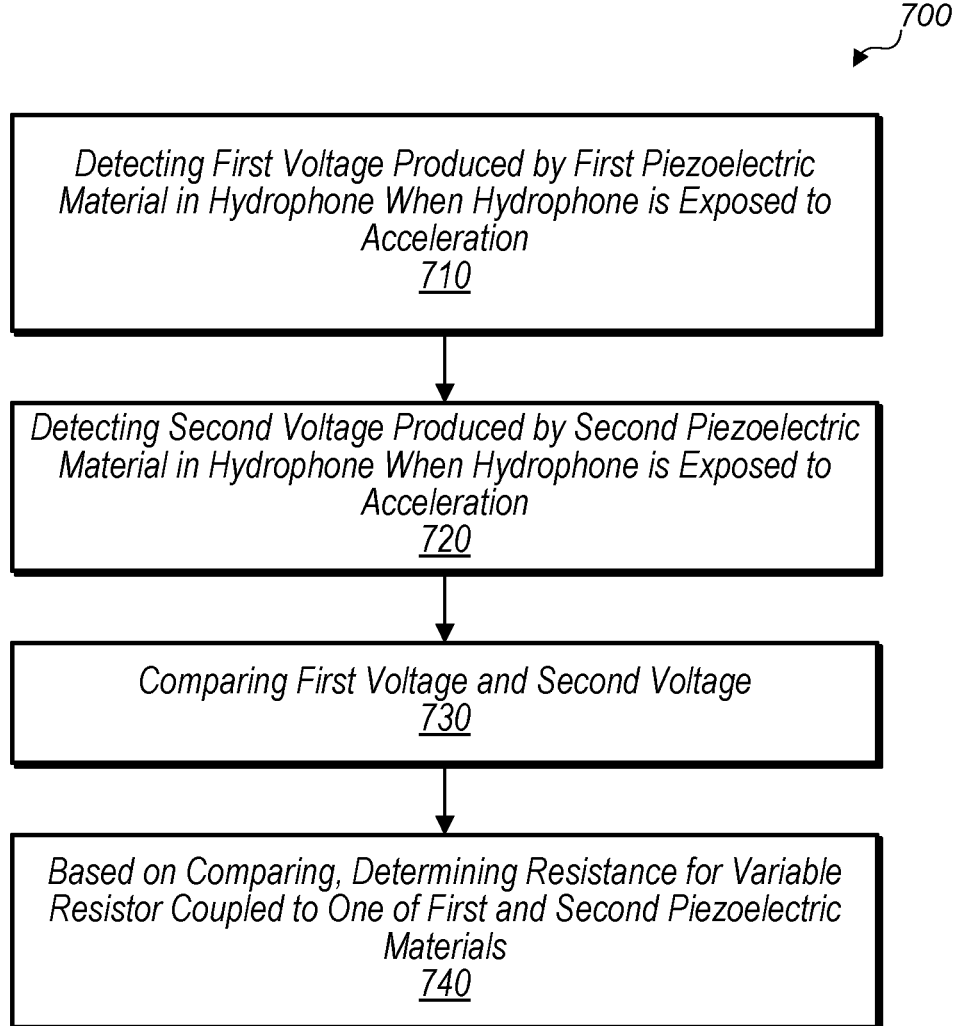
FIGS. 7-9 are flow diagrams illustrating exemplary methods for calibrating sensors configured to measure pressure and acceleration, according to some embodiments.

Turning now to FIG. 7, a block diagram of a method 700 is shown. Method 700 is one embodiment of a method performed by a computer system (or other entity) to calibrate sensors (e.g., sensors 202). In some embodiments, method 700 is performed prior to the sensors being placed on a streamer and may be performed using a shaker table.

Method 700 begins in step 710 with the computer system detecting a first voltage (e.g., a differential voltage measured between circuit lines 215A-B) produced by a first piezoelectric material (e.g., ceramic 204A) in a hydrophone when the hydrophone is exposed to an acceleration (e.g., an acceleration 320). The hydrophone may be exposed to an acceleration in the absence of pressure (e.g., pressure 310). In step 720, the computer system detects a second voltage (e.g., the differential voltage measured between circuits lines 215C-D) produced by a second piezoelectric material (e.g., ceramic 204B) in the hydrophone when the hydrophone is exposed to the acceleration.

In various embodiments, the computer system detects a third voltage (e.g., the differential voltage measured between amplifier lines 225A-B) produced by a first amplifier (e.g., amplifier 220A) coupled to the hydrophone when the hydrophone is exposed to a pressure (e.g., pressure 310). In such embodiments, the computer system detects a fourth voltage (e.g., the differential voltage measured between lines 225C-D) produced by a second amplifier (e.g., amplifier 220B) coupled to the hydrophone when the hydrophone is exposed to the pressure. The first and second amplifiers may be coupled to a plurality of other hydrophones (e.g., sensor pairs 200 within array 510) that have respective first and second piezoelectric materials. In some embodiments, the first amplifier is coupled to ones of the respective first piezoelectric materials and the second amplifier is coupled to ones of the respective second piezoelectric materials.

In step 730, the computer system compares the first voltage and the second voltage. In some embodiments, step 730 further includes the computer system comparing the third voltage and the fourth voltage.

In step 740, the computer system determines, based on the comparing, a resistance for a variable resistor (e.g., resistor 410A or 410B) coupled to one of the first and second piezoelectric materials. In various embodiments, the resistance is determined such that the variable resistor adjusts a first subsequent voltage that is produced by the first piezoelectric material to match (e.g., a match within five percent) a second subsequent voltage produced by the second piezoelectric material when the hydrophone is exposed to a subsequent acceleration. In various embodiments, the computer system, based on the comparing of the third and fourth voltages, determines an adjustment for at least one of the first and second amplifiers. The adjustment may be determined such that a third subsequent voltage produced by the first amplifier matches a fourth subsequent voltage produced by the second amplifier when the hydrophone is exposed to a subsequent pressure (in absence of acceleration in various cases). In various embodiments, the variable resistor is included in a voltage divider circuit (e.g., calibration circuits 210A) coupled to the first piezoelectric material. The voltage divider circuit may be configured to adjust the voltages produced by the first piezoelectric material. In various embodiments, method 700 includes additional steps such as performing at least one measurement of an acceleration and a pressure being experienced by a hydrophone (e.g., system 105) while a streamer having the hydrophone is being towed behind a survey vessel (e.g., vessel 110).

Figure 8:
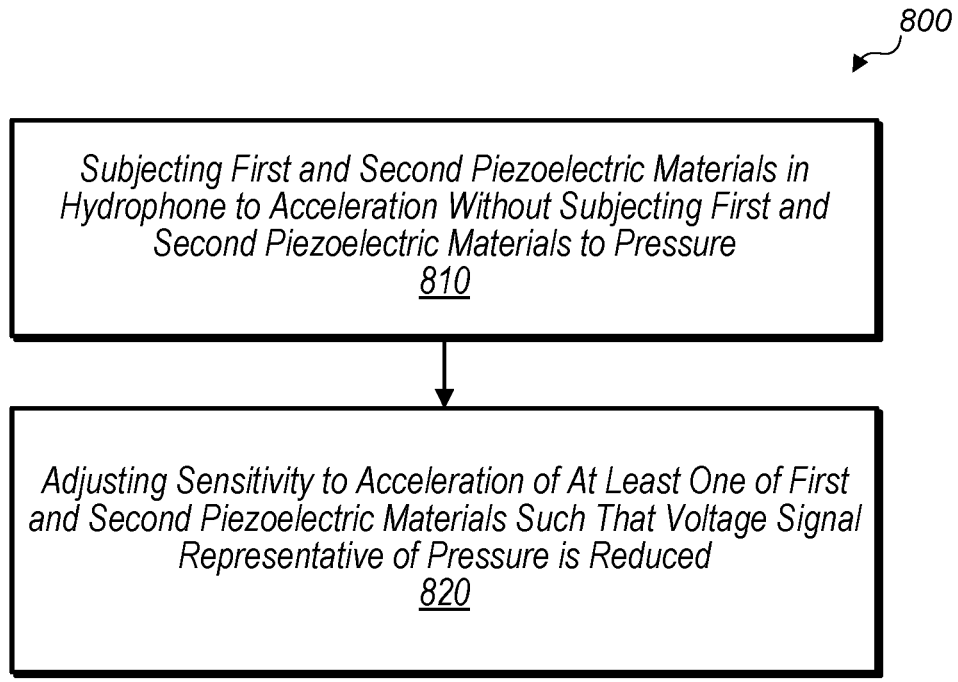

Turning now to FIG. 8, a block diagram of a method 800 is shown. Method 800 is one embodiment of a method performed by a computer system (or other entity) to calibrate sensors (e.g, sensors 202) that are configured to measure pressure (e.g., pressure 310) and acceleration (e.g., acceleration 320). Method 800, in some embodiments, is performed prior to the sensors being placed on a streamer (e.g., streamer 140) and may be performed using a shaker table.

Method 800 begins in step 810 with first and second piezoelectric materials (e.g., ceramics 204A and 204B) in a hydrophone being subjected to an acceleration without being subjected to a pressure. The first and second piezoelectric materials being subjected to the acceleration may cause them to produce a voltage signal representative of pressure. The first and second piezoelectric materials, in some embodiments, are subjected to a pressure without being subjected to an acceleration. This subjection to a pressure may cause the first and second piezoelectric materials to produce a voltage signal representative of acceleration.

In step 820, a sensitivity to acceleration of at least one of the first and second piezoelectric materials is adjusted such that the voltage representative of pressure is reduced. Adjusting the sensitivity to acceleration may include determining an adjustment to a mass of at least one piezoelectric material. Adjusting the sensitivity may also include determining a resistance for a voltage divider network (e.g., calibration circuits 210) such that the network matches a sensitivity to accelerations of the first piezoelectric with a sensitivity to acceleration of the second piezoelectric material. In some embodiments, a balance between first and second amplifiers (e.g., amplifiers 220) coupled to the first and second piezoelectric materials is adjusted such that a voltage signal representative of acceleration is reduced. In some embodiments, method 800 includes additional steps such as measuring at least a pressure and an acceleration experienced by first and second piezoelectric sensors (e.g., sensors 202A-B) while the geophysical equipment (e.g., streamer 140) that includes them is being towed by a survey vessel (e.g., vessel 110).

Figure 9:
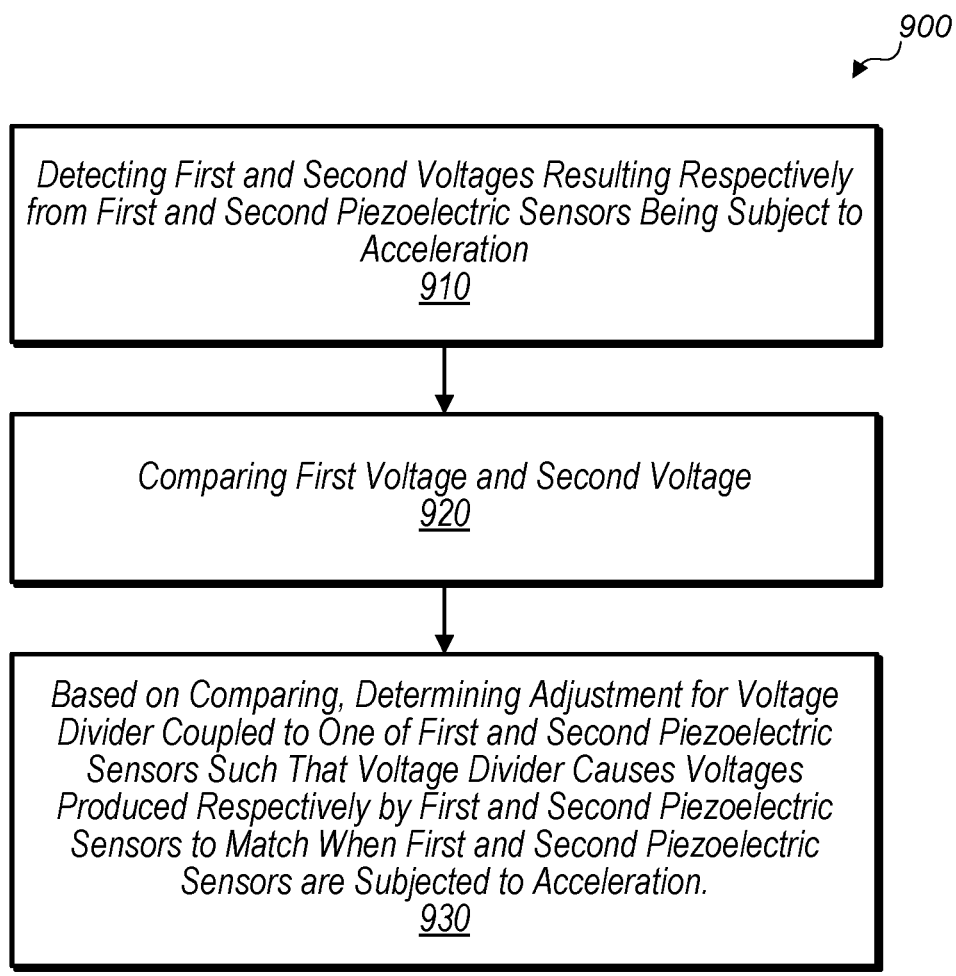

Turning now to FIG. 9, a block diagram of a method 900 is shown. Method 900 is one embodiment of a method performed by a computer system (or other entity) to calibrate sensors (e.g., sensors 202) that are configured to measure pressure (e.g., pressure 310) and acceleration (e.g., acceleration 320).

Method 900 begins in step 910 with first and second voltages being detected that result respectively from first and second piezoelectric sensors (e.g., sensors 202) being subjected to an acceleration. In some embodiments, third and fourth voltages are detected that result respectively from the first and second piezoelectric materials being subjected to a pressure. In step 920, the first voltage and the second voltage are compared. The third and fourth voltage may also be compared.

In step 930, based on the comparing in step 920, an adjustment for a voltage divider (e.g., calibration circuits 210) that is coupled to one of the first and second piezoelectric sensors is determined such that the voltage divider causes voltages produced respectively by the first and second piezoelectric sensors to match when the sensors are subjected to acceleration. In embodiments in which third and fourth voltages are detected, based on the comparing in step 920, an adjustment for a first amplifier (e.g., amplifier 220A) coupled to one of the first and second piezoelectric sensors is determined such that the first amplifier causes voltages produced respectively by the first and second piezoelectric sensors to match when the first and second piezoelectric sensors are subjected to pressure.

Figure 10:
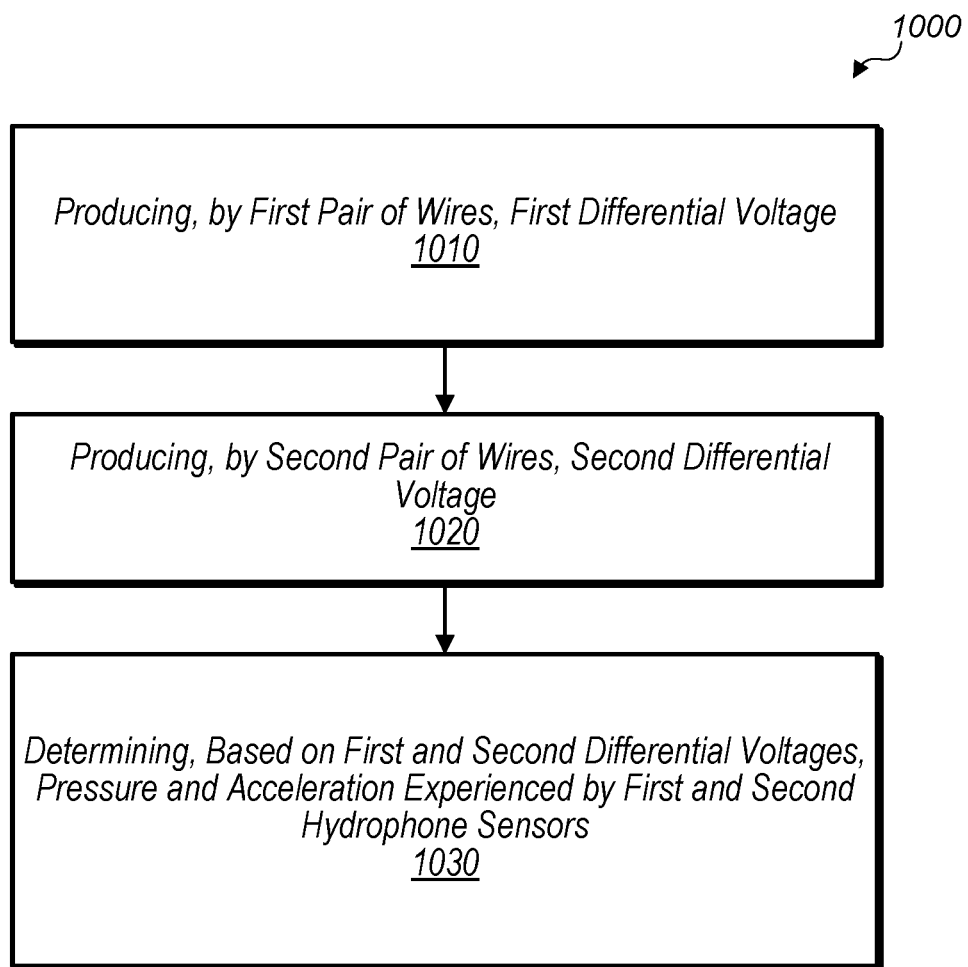
FIG. 10-12 are flow diagrams illustrating exemplary methods for measuring both pressure and acceleration using the same sensors, according to some embodiments.

Turning now to FIG. 10, a block diagram of a method 1000 is shown. Method 1000 is one embodiment of a method performed by a system (e.g., sensor system 105) to measure acceleration (e.g., acceleration 320) and pressure (e.g., pressure 310). In some embodiments, method 1000 is performed after the system is placed on a streamer.

Method 1000 begins in step 1010 with a first pair of wires (e.g., sensor lines 205A-B) of the system producing a first differential voltage. In some embodiments, one of the wires (e.g., 205A) in the first pair is coupled to a first housing structure (e.g., brass housing 206A) included in a first hydrophone sensor (e.g., sensor 202A) of the system. The other wire in the first pair (e.g., 205B) may be coupled to a first piezoelectric material (e.g., ceramic 204A) that is included in the first hydrophone sensor.

In step 1020, a second pair of wires (e.g., sensor lines 205C-D) of the system produces a second differential voltage. In some embodiments, one of the wires (e.g., 205C) in the second pair is coupled to a second housing structure (e.g., brass housing 206B) that is included in a second hydrophone sensor (e.g., sensor 202B) of the system. The other wire in the second pair (e.g., 205D) may be coupled to a second piezoelectric material (e.g., ceramic 204B) included in the second hydrophone sensor. In some embodiments, a first voltage divider (e.g., circuit 210A) of the system adjusts the first differential voltage provided by the first pair of wires. The first voltage divider may include a first variable resistor (e.g., resistor 410A) configured to facilitate adjustment of the first differential voltage. In some embodiments, a second voltage divider (e.g., circuit 210B) of the system adjusts the second differential voltage provided by the second pair of wires. The second voltage divider may include a second variable resistor (e.g., resistor 410B). The first and the second variable resistors may be used to remove an imbalance between voltages that are generated by the first and the second piezoelectric materials.

In step 1030, the system determines, based on the first and the second differential voltages, a pressure and an acceleration experienced by the first and the second hydrophone sensors. In some embodiments, a first differential amplifier (e.g., amplifier 220A) of the system is coupled to the first voltage divider and is configured to amplify the first differential voltage. In some embodiments, a second differential amplifier (e.g., amplifier 220B) of the system is coupled to the second voltage divider and is configured to amplify the second differential voltage. In various embodiments, the system determines the acceleration by determining a difference between the first and the second differential voltages. In various embodiments, the system determines the pressure by adding the first and the second differential voltages.

Figure 11:
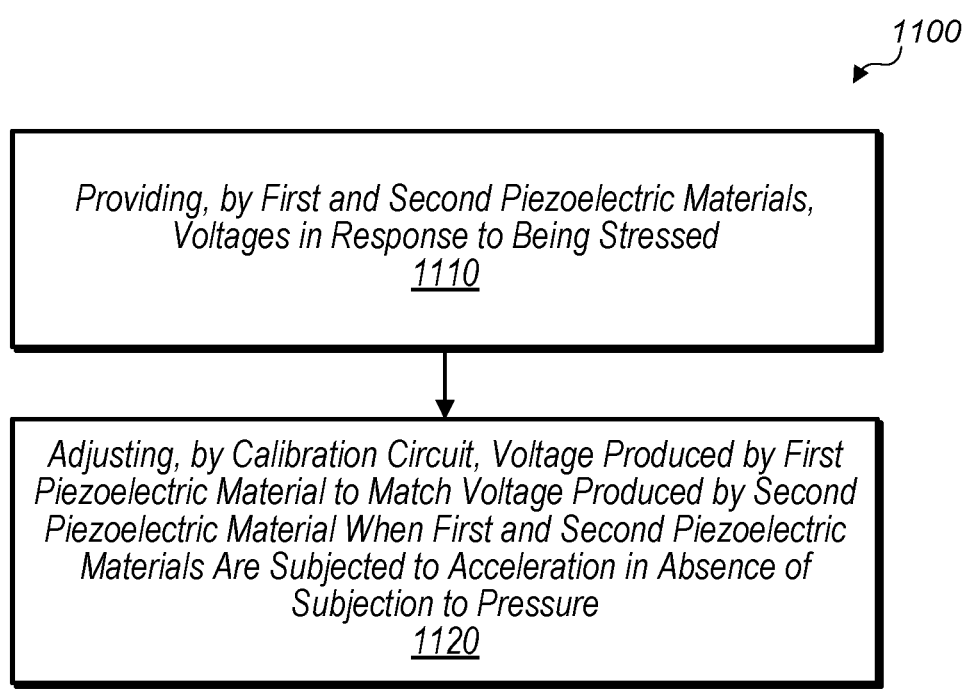

Turning now to FIG. 11, a block diagram of a method 1100 is shown. Method 1100 is one embodiment of a method performed by a system (e.g., system 105) to measure both acceleration (e.g., acceleration 320) and pressure (e.g., pressure 310). The system may be configured to measure pressure and acceleration while being towed in a streamer behind a seismic vessel.

Method 1100 begins in step 1110 with first and second piezoelectric materials (e.g., ceramics 204A-B) providing voltages in response to being stressed. In some embodiments, the first and second piezoelectric materials are included in first and second hydrophone sensors (e.g., sensors 202A-B), respectively.

In step 1120, a calibration circuit (e.g., circuit 210A) adjusts a voltage produced by the first piezoelectric material to match a voltage produced by the second piezoelectric material when the first and second piezoelectric materials are subjected to an acceleration (e.g., 320) in the absence of a subjection to a pressure (e.g., 310). In some embodiments, the calibration circuit is a voltage divider network that is coupled to the first piezoelectric material. In some embodiments, an amplifier circuit (e.g., amplifier 220A) adjusts a voltage that results from the calibration circuit to match a voltage associated with the second piezoelectric material when the first and second piezoelectric materials are subjected to a pressure in the absence of a subjection to an acceleration. In various embodiments, the voltages provided in response to being stressed are indicative of an acceleration and a pressure experienced by the first and second piezoelectric materials.

Figure 12:
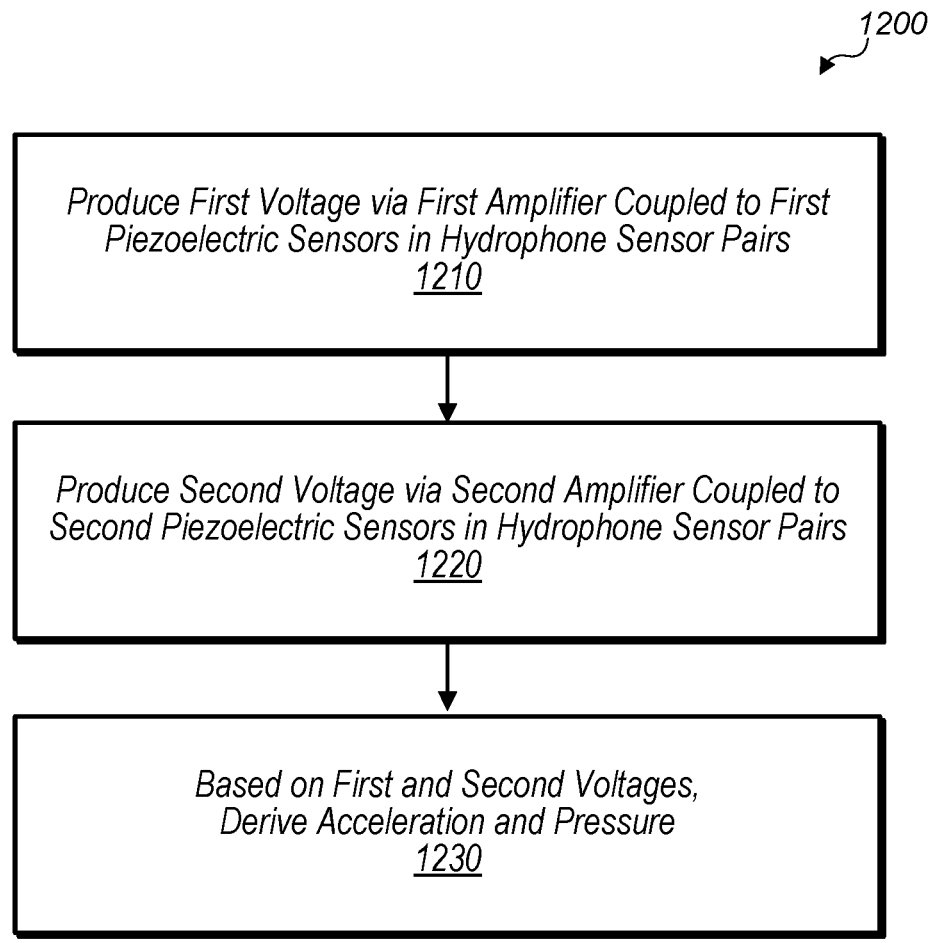

Turning now to FIG. 12, a block diagram of a method 1200 is shown. Method 1200 is one embodiment of a method performed by a system (e.g., sensor system 105) to measure acceleration (e.g., acceleration 320) and pressure (e.g., pressure 310).

Method 1200 begins in step 1210 with a first amplifier (e.g., amplifier 220A) coupled to first piezoelectric sensors in a set of hydrophone sensor pairs providing a first voltage (e.g., amplifier output 225A). In some embodiments, the first amplifier is configured to produce the first voltage such that the first voltage is a differential between a voltage produced by a first piezoelectric material included in a first piezoelectric sensor and a voltage produced by a second piezoelectric material included in the first piezoelectric sensor. In step 1220, a second amplifier (e.g., amplifier 220B) coupled to second piezoelectric sensors in the set of hydrophone sensor pairs provides a second voltage (e.g., amplifier output 225B.) In step 1230, an acceleration and a pressure are derived based on the first and second voltages (e.g., via add block 620 and subtract block 610).

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The invention claimed is:

1. An apparatus, comprising:
a first hydrophone sensor having a first piezoelectric material and a first housing structure;
a second hydrophone sensor having a second piezoelectric material and a second housing structure;
a first pair of wires configured to provide a first differential voltage, wherein a first one of the first pair of wires is coupled to the first housing structure and a second one of the first pair of wires is coupled to the first piezoelectric material; and
a second pair of wires configured to provide a second differential voltage, wherein a first one of the second pair of wires is coupled to the second housing structure and a second one of the second pair of wires is coupled to the second piezoelectric material;
a first voltage divider configured to adjust the first differential voltage provided by the first pair of wires, wherein the first voltage divider includes a first variable resistor configured to facilitate adjustment of the first differential voltage;
a second voltage divider configured to adjust the second differential voltage provided by the second pair of wires, wherein the second voltage divider includes a second variable resistor configured to facilitate adjustment of the second differential voltage;
wherein the apparatus is configured to determine, based on the first and second differential voltages, a pressure and an acceleration experienced by the first and second hydrophone sensors; and
wherein the first and second variable resistors are configurable to remove an imbalance between voltages generated by the first and second piezoelectric materials.

2. The apparatus of claim 1, further comprising:
a first differential amplifier coupled to the first voltage divider and configured to amplify the first differential voltage; and
a second differential amplifier coupled to the second voltage divider and configured to amplify the second differential voltage.

3. The apparatus of claim 1, wherein the apparatus is configured to determine the acceleration by determining a difference between the first differential voltage and the second differential voltage.

4. The apparatus of claim 1, wherein the apparatus is configured to determine the pressure by adding the first differential voltage and the second differential voltage.

5. The apparatus of claim 1, wherein the apparatus is a streamer having a plurality of sets of hydrophone sensor pairs, and wherein a first set of the plurality of sets includes the first and second hydrophone sensors.

6. The apparatus of claim 5, wherein the plurality of sets of hydrophone sensor pairs are arranged such that the first set is configured to measure an acceleration in a first direction and a second set of the plurality of sets of hydrophone sensor pairs is configured to measure an acceleration in a second direction orthogonal to the first direction.

7. The apparatus of claim 5, wherein a respective first hydrophone sensor, of two or more of the first set of hydrophone sensor pairs, is coupled to a first differential amplifier and a respective second hydrophone sensor, of the two or more of the first set of hydrophone sensor pairs, is coupled to a second differential amplifier.

8. An apparatus, comprising:
- a first hydrophone sensor having a first piezoelectric material;
- a second hydrophone sensor having a second piezoelectric material, wherein the first and second piezoelectric materials are configured to provided voltages in response to being stressed; and
- a calibration circuit coupled to the first piezoelectric material and configured to adjust a voltage produced by the first piezoelectric material to match a voltage produced by the second piezoelectric material when the first and second piezoelectric materials are subjected to an acceleration, wherein the calibration circuit is a voltage divider network that includes a variable resistor that is adjustable to affect an adjustment of the voltage produced by the first piezoelectric material; and
- wherein the voltages provided in response to being stressed are indicative of an acceleration and a pressure experienced by the first and second piezoelectric materials.

9. The apparatus of claim 8, further comprising:
- an amplifier circuit coupled to the calibration circuit and configured to adjust a voltage from the calibration circuit to match a voltage associated with the second piezoelectric material when the first and second piezoelectric materials are subjected to a pressure.

10. The apparatus of claim 9, further comprising:
- an array of hydrophone sensor pairs, wherein one of the hydrophone sensor pairs includes the first and second hydrophone sensors, and wherein one or more of the hydrophone sensor pairs are coupled to a respective calibration circuit that is coupled to the amplifier circuit.

11. The apparatus of claim 8, wherein the first and second piezoelectric materials are piezoelectric ceramics, wherein the apparatus is a streamer, and wherein the first and second hydrophone sensors are one of a plurality of hydrophone sensor pairs included in the streamer.

12. An apparatus, comprising:
- a set of hydrophone sensor pairs configured to facilitate a measuring of acceleration and pressure, wherein the set of hydrophone sensor pairs includes respective first and second piezoelectric sensors;
- a voltage divider coupled to a first hydrophone sensor pair, of the set of hydrophone sensor pairs, and configured to adjust voltages produced by the first hydrophone sensor pair, wherein the voltage divider includes a resistance adjustable to match a voltage produced by the respective first piezoelectric sensor included in the first hydrophone sensor pair to a voltage produced by the respective second piezoelectric sensor included in the first hydrophone sensor pair;
- a first amplifier coupled to the respective first piezoelectric sensors, wherein the first amplifier is configured to produce a first voltage;
- a second amplifier coupled to the respective second piezoelectric sensors, wherein the second amplifier is configured to produce a second voltage; and
- wherein the apparatus is operable to derive an acceleration and a pressure based on the first and second voltages.

13. The apparatus of claim 12, wherein the first amplifier is configured to produce the first voltage such that the first voltage is a differential between a voltage produced by a first piezoelectric material included in the respective first piezoelectric sensor and a voltage produced by a second piezoelectric material included in the respective first piezoelectric sensor.

14. The apparatus of claim 12, wherein the first hydrophone sensor pair is oriented such that the first hydrophone sensor pair is configured to measure acceleration in a first direction, and wherein a second hydrophone sensor pair, of the set of hydrophone sensor pairs, is oriented such that the second hydrophone sensor pair is configured to measure acceleration in a second direction that is perpendicular to the first direction.

15. The apparatus of claim 12, wherein the apparatus comprises a streamer configured to measure acceleration and pressure while being towed behind a survey vessel, and wherein the apparatus includes a plurality of hydrophone sensor pairs.

* * * * *